(12) United States Patent
Chaudhary et al.

(10) Patent No.: US 9,330,225 B2
(45) Date of Patent: May 3, 2016

(54) PHOTOMASK ERROR CORRECTION

(71) Applicant: International Business Machines Corporation, Armonk, NY (US)

(72) Inventors: Aditya Chaudhary, Bangalore (IN); Kalpesh G. Dave, Bangalore (IN); Mini M. Ghosal, Pune (IN); Ioana Graur, Poughkeepsie, NY (US); Bhavani P. Kumar, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/296,705

(22) Filed: Jun. 5, 2014

(65) Prior Publication Data
    US 2015/0356228 A1    Dec. 10, 2015

(51) Int. Cl.
    *G06F 17/50*    (2006.01)
(52) U.S. Cl.
    CPC .................................. *G06F 17/5081* (2013.01)
(58) Field of Classification Search
    USPC .......................................................... 716/52
    See application file for complete search history.

(56) References Cited

U.S. PATENT DOCUMENTS

| | | |
|---|---|---|
| 6,952,818 B2 | 10/2005 | Ikeuchi |
| 7,353,145 B2 | 4/2008 | Tanaka et al. |
| 7,657,852 B2 | 2/2010 | Waller |
| 7,752,595 B2 | 7/2010 | Maeda et al. |
| 7,865,864 B2 | 1/2011 | Banerjee et al. |
| 7,926,002 B2 | 4/2011 | Word et al. |
| 7,966,586 B2 | 6/2011 | Lei et al. |
| 8,037,428 B2 | 10/2011 | Tong et al. |
| 8,086,981 B2 | 12/2011 | Lai et al. |
| 8,108,804 B2 | 1/2012 | Graur et al. |
| 8,146,026 B2 | 3/2012 | Agarwal et al. |

(Continued)

FOREIGN PATENT DOCUMENTS

WO    2007020439 A1    2/2007

OTHER PUBLICATIONS

He, Y. et al. "Simulation-Based Pattern Matching Using Scanner Metrology and Design Data to Reduce Reliance on CD Metrology" Proc. SPIE 7640, Optical Microlithography XXIII (Mar. 4, 2010) 10 pages, vol. 7640.

(Continued)

*Primary Examiner* — Eric Lee
(74) *Attorney, Agent, or Firm* — Scully, Scott, Murphy & Presser, P.C.; Steven J. Meyers (57) ABSTRACT

Design errors generated employing a mask rule check (MRC) program are indexed and examined one by one by an automated computer program connected to a false error pattern database that contains previously known waivered patterns, a real error pattern database that contains previously known pairs of an error-containing pattern and a corresponding error-free pattern, and optionally a mask house rule database. A waiver is applied to each design error for which a matching pattern is found in the false error pattern database. Each design error for which a match is found in the real error pattern database is modified to substitute an error-free pattern for an error-containing pattern therein. The output of the automated program includes a list of design errors for which no solution is found by the automated program.

19 Claims, 5 Drawing Sheets

(56) References Cited

U.S. PATENT DOCUMENTS

| | | | |
|---|---|---|---|
| 8,640,079 B2 * | 1/2014 | Majumder et al. | 716/139 |
| 2007/0044060 A1 | 2/2007 | Waller | |
| 2007/0192754 A1 * | 8/2007 | Hofsaess | 716/5 |
| 2010/0013105 A1 | 1/2010 | Lin et al. | |
| 2010/0122227 A1 | 5/2010 | Waller | |
| 2010/0257496 A1 | 10/2010 | Ferguson et al. | |
| 2011/0066996 A1 | 3/2011 | Koyuncu et al. | |
| 2011/0219352 A1 | 9/2011 | Majumder et al. | |
| 2012/0317524 A1 | 12/2012 | Taoka | |
| 2013/0071007 A1 | 3/2013 | Gabrani et al. | |

OTHER PUBLICATIONS

He, Y. et al. "A Study on the Automation of Scanner Matching" Proc. SPIE 8683 Optical Microlithography XXVI, 86830W (Apr. 2013) pp. 86830W-1-86830W-11, vol. 8683.

Szucs, A. et al., "Best Focus Shift Mitigation for Extending the Depth of Focus" Proc. SPIE 8683 Optical Microlithography XXVI (Apr. 12, 2013) pp. 868313-1-868313-10 vol. 8683.

Beylier, C. et al., "Demonstration of an effective Flexible Mask Optimization (FMO) flow" Proc. SPIE 8326, Optical Microlithography XXV (Feb. 2012) pp. 832616-1-832616-8, vol. 8326.

* cited by examiner

PHOTOMASK ERROR CORRECTION

BACKGROUND

The present disclosure relates to a methodology for correcting design errors in a photomask design layout and a system for implementing the same.

Errors in a photomask design layout cause costly interruptions during manufacture of a physical photomask as well as a high probability of generating a hot spot in a printed lithographic pattern that can result in an anomaly in a printed pattern. A mask rule check (MRC) program is typically run to generate a list of design errors in the photomask design layout so that each design error can be inspected and corrected before generating an error-free photomask design layout. However, the process of reviewing and correcting the design errors can be time-consuming because MRC programs tend to catch many design errors when the design layout includes many device components. For example, it is not uncommon for a design layout representing a collection of billions of semiconductor devices to generate a list of design errors numbering thousands of even tens of thousands of design errors even at a later stage of design layout correction.

SUMMARY

Design errors generated employing a mask rule check (MRC) program are indexed and examined one by one by an automated computer program connected to a false error pattern database that contains previously known waivered patterns, a real error pattern database that contains previously known pairs of an error-containing pattern and a corresponding error-free pattern, and optionally a mask house rule database. A waiver is applied to each design error for which a matching pattern is found in the false error pattern database. Each design error for which a match is found in the real error pattern database is modified to substitute an error-free pattern for an error-containing pattern therein. Additional waivers may be applied employing the mask house rule database. The output of the automated program includes a list of design errors for which no solution is found by the automated program. The number of the design errors in the output list can be significantly less than the number of design errors as generated by the MRC, and human intervention in resolving the design errors can be reduced.

According to an aspect of the present disclosure, a method of modifying a design layout is provided. An indexed list of design errors that are present in a design layout is provided. By running a first program on a computing means, determination is made, for each design error in the indexed list, on whether a match exists in a false error pattern database that contains previously known waivered patterns. By running a second program on the computing means or another computing means, determination is made, for each design error that has been determined not to have a match in the false error pattern database, on whether a match exists in a real error pattern database that contains previously known pairs of an error-containing pattern and a corresponding error-free pattern. By running the second program or a third program on the computing means, the other computing means, or yet another computing means, a matched error-containing portion of each design error of the design layout that has been determined to have a match in the real error pattern database is replaced with a corresponding error-free pattern.

According to another aspect of the present disclosure, a system for modifying a design layout is provided. The system includes a computing means and a non-transitory machine-readable data storage medium. The computing means includes a processor and a memory that are configured to run an automated program. The automated program includes a step of receiving an indexed list of design errors that are present in a design layout. The automated program further includes a step of determining, for each design error in the indexed list, whether a match exists in a false error pattern database that contains previously known waivered patterns. The automated program further includes a step of determining, for each design error that has been determined not to have a match in the false error pattern database, whether a match exists in a real error pattern database that contains previously known pairs of an error-containing pattern and a corresponding error-free pattern. In addition, the automated program includes a step of replacing a matched error-containing portion of each design error of the design layout that has been determined to have a match in the real error pattern database with a corresponding error-free pattern.

DETAILED DESCRIPTION

As stated above, the present disclosure relates to a methodology for correcting design errors in a photomask design layout and a system for implementing the same, which are now described in detail with accompanying figures. These aspects of the present disclosure are now described in detail with accompanying figures. The drawings are not necessarily drawn to scale. As used herein, ordinals such as "first" and "second" are employed merely to distinguish similar elements, and different ordinals may be employed to designate a same element in the specification and/or claims.

As used herein, a "design layout" refers to a set of data stored in a machine-readable medium and representing layout of semiconductor devices on a substrate.

As used herein, a "design level" refers to a set of data within a design layout that corresponds to structures that are patterned employing a same lithographic patterning step.

As used herein, a "design shape" refers to a set of data located in a design level and representing a shape of an object in a target structures.

As used herein, a "design clip" refers to a subset of a design layout for a semiconductor chip that is less than the entirety of the design layout.

As used herein, a "photomask" refers to a lithographic mask including a pattern for a design level within a design layout and configured to be employed in a lithographic tool to generate a pattern corresponding to the pattern in the design level.

As used herein, a "mask rule check" or "MRC" refers to a step of checking for violations of design rules that pertain to mask manufacturability in a design layout. Design rules that pertain to mask manufacturability are typically generated by a mask house and imposed on design layouts for which at least one photomask is to be manufactured in the mask house.

As used herein, a "mask rule error" refers to an error in a design layout that violates design rules that pertain to mask manufacturability, i.e., an error that fails the step of mask rule check. Each mask rule error is caused by at least one design feature in a design shape.

Figure 1:
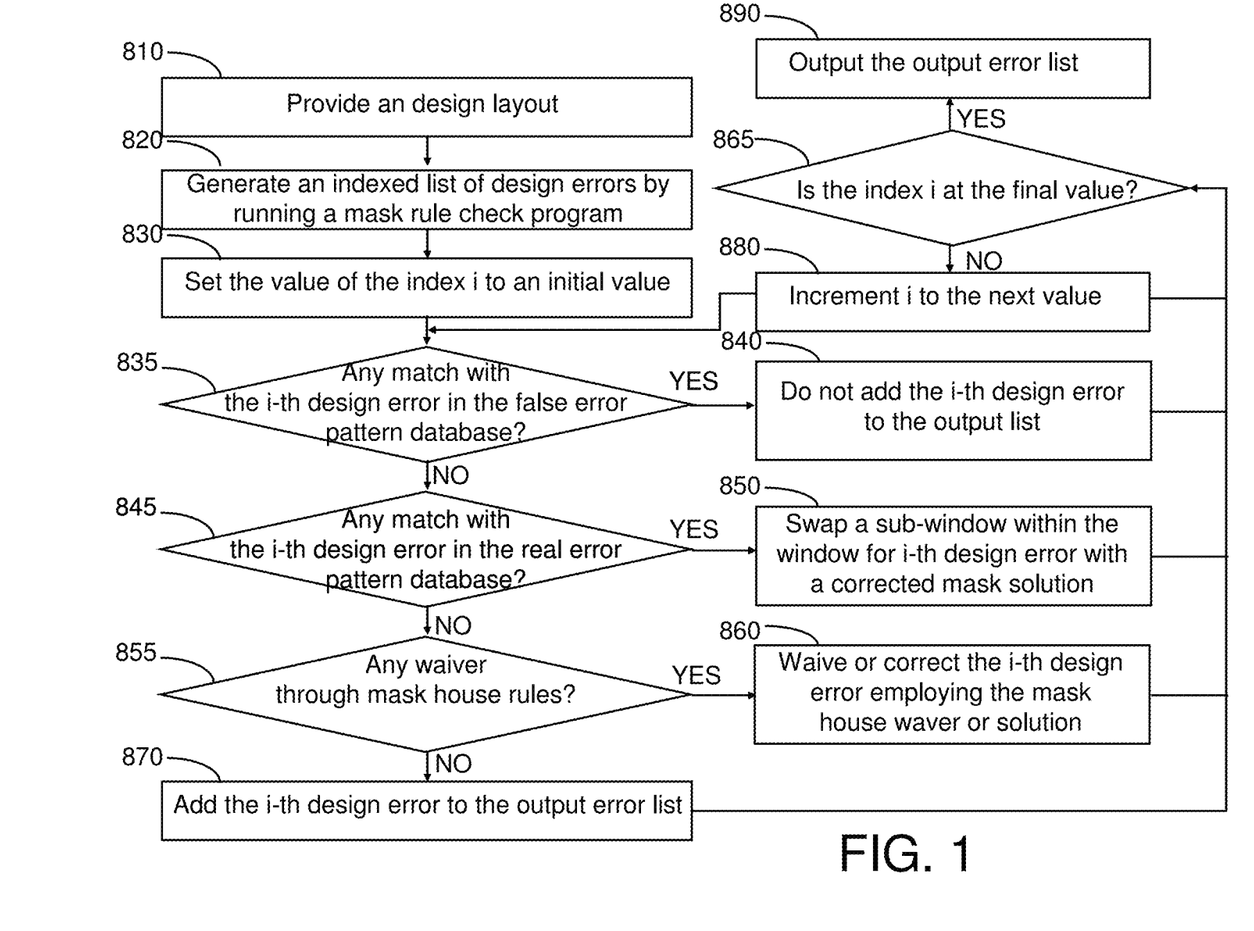
FIG. 1 is a flow chart illustrating a method of modifying a design layout according to an embodiment of the present disclosure.

Referring to FIG. 1, a flow chart according to an embodiment of the present disclosure illustrates a method of modifying a design layout in order to reduce design errors. Referring to step 810 of the flow chart, a design layout is provided. The design layout can include a plurality of design levels representing a complete set of data for manufacturing a semiconductor chip, or can include a single design level. The design layout may be any design layout that has not been proven to be free of any mask rule error, i.e., any design layout that has not passed the stage of checking for mask rule errors as a design layout that is free of mask rule errors.

Referring to step 820 of the flow chart, an indexed list of design errors is generated by running a mask rule check program on the design layout. The design layout is checked for violations of design rules pertaining to mask manufacturability, which may be provided by the mask house that will manufacture a photomask including a modified version of the design layout that is substantially free of design errors. The design layout can be checked by running a processing step within an automated program that is specifically encoded to detect violations of the design rules pertaining to mask manufacturability applicable to the design rules provided at step 810 of the flow chart. Once a set of design errors is detected by the processing step of the automated program, the set of design errors can be ordered to be indexed according to a predetermined indexing scheme. For example, if N design errors are detected by the processing step of the automated program, the N design errors can be indexed with an index i having natural numbers from 1 to N.

In one embodiment, the machine that runs the processing step of the automated program for step 820 of the flow chart may be the same machine (or machines) that will run subsequent steps such as steps 830, 835, 845, and 855 of the flow chart. In this case, the same automated program can include the processing step for step 820 of the flow chart. Alternately, the machine that runs the processing step of the automated program for step 820 of the flow chart may be a different machine than the machine (or machines) that will run subsequent steps such as steps 830, 835, 845, and 855 of the flow chart.

Referring to step 830, the indexed list of design errors is provided to an automated program that runs on a system for modifying a design layout. The system includes a computing means and a non-transitory machine-readable data storage medium. The computing means includes a processor and a memory that are configured to run the automated program. The system receives the indexed list of design errors from the processing step of an automated program corresponding to step 820 of the flow chart. The processing step of the automated program that runs instructions for performing the task at step 830 of the flow chart may be performed within the same system as, or may be performed in a system different from, the system that runs the processing step of step 820 of the flow chart.

The indexed list of design errors is analyzed to determine a unique set of values for an index i that identifies each and every design error in the indexed design list. Subsequently, the value of the index i is set to be an initial value that corresponds to the first design layout error to be analyzed. For example, if N design errors are present within the indexed list of design errors, and if the N design errors are indexed with an index i having natural numbers from 1 to N as values, then the value of the index i can be set to be 1 at this step.

Referring to step 835, an automated program, which is herein referred to as a first automated program, determines whether any match exists for the i-th design error in a falser error pattern database. As used herein, a "false error pattern database" refers to a database that contains false error patterns. As used herein, a "false error pattern" refers to previously known waived patterns, i.e., design patterns that were previously determined to contain a design error and subsequently waived for the purpose of design rule check. The reason for application of the subsequent waiver may be a detailed analysis, simulation, and/or empirical observation at a mask house or on a printed photoresist layer, that resulted in a determination that the particular type of design error does not cause a real problem at the mask house. The false error pattern database includes a collection of false error patterns generated from previous work on another design layout or the design layout provided at step 810.

At step 835 of the flow chart, a design clip including the feature that causes the i-th design error is generated by running a first automated program. The first automated program is run on a computing means, which can be the same as, or different from, the computing means on which the automated program of step 820 of the flow chart is run.

In one embodiment, the design clip can have a predetermined size around the feature that triggers the i-th design error. The predetermined size can be determined by the optics of the lithography system to be employed to print patterns of the design layout. For example, for a design layout to be employed in conjunction with a 193 nm wavelength lithography system, the design clip can have be a rectangle in which each side has a dimension in a range from 0.6 micron to 2 microns, although lesser and greater dimensions can also be employed. In an illustrative example, the design clip can have a square size with the length of each side set at 1.0 micron.

Alternatively, each false error pattern in the false error pattern database can have an associated matching window for the corresponding false error pattern. The matching window can have the same size as, or can be smaller than, the size of the false error pattern. The size of the false error patterns can vary across the false error patterns. The size of the matching window can also vary across the false error patterns. The matching window includes a feature that triggers detection of a design error by the mask rule check program, and includes a minimum size required to ensure that any pattern that matches the minimum size can be safely classified as a false error. In other words, the matching window is a subset of the false error pattern that defines the minimum area of an exact match before determining another design pattern to be a false error. In this case, if a subset of the design clip associated with the i-th design error matches the matching window of a false error pattern, the i-th design error is a false error.

It is noted that the false error patterns in the false error pattern database do not need to be in the same size as the design clips identified at step 835 of the flow chart, but can be larger than the size of the design clips identified at step 835 based on the design errors analyzed therein.

The first automated program determines whether a match exists between the design clip derived from the i-th design error and the false error patterns in the false error pattern database by performing pattern matching. Depending on whether a match is found in the false error pattern database for the design clip corresponding to the i-th design error, the i-th design error is classified into a false design error or a real design error. Specifically, if a match is found in the false error pattern database for the design clip corresponding to the i-th design error, the i-th design error is classified into a false design error, and the process flow proceeds to step 840. If a match is not found in the false error pattern database for the design clip corresponding to the i-th design error, the i-th design error is classified into a real design error, and the process flow proceeds to step 845.

Through iteration of step 835 with different values for the index i, each design error in the indexed list of design errors is analyzed and categorized as a false design error or a real design error. Each design error for which a match is found in the false error pattern database as a false error, and each design error for which a match is not found in the false error pattern database is classified as a real error.

Figure 2A:
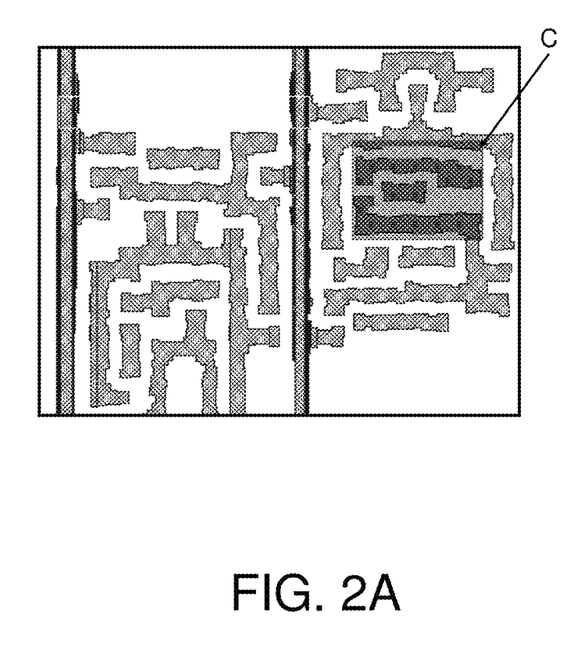
FIG. 2A is an exemplary design clip including a false design error according to an embodiment of the present disclosure.
Figure 2B:
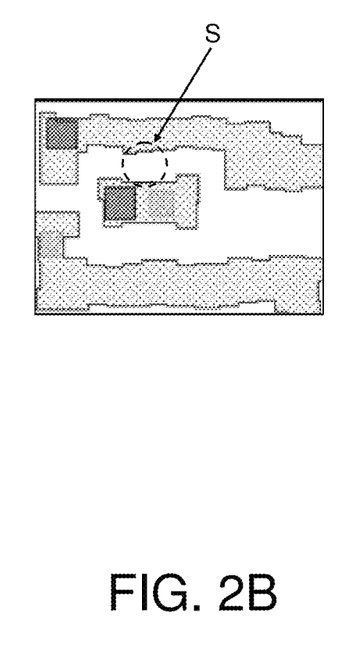
FIG. 2B is an exemplary false error pattern in a false error pattern database according to an embodiment of the present disclosure.

The comparison of the design clip generated from the i-th design error and the false error patterns in the false error pattern database is illustrated employing examples shown in FIGS. 2A and 2B.

FIG. 2A illustrates an exemplary design layout including a false design error. In this example, the false error is triggered by violation of a minimum spacing rule between two design shapes representing line structures. A design clip C derived from the false design error and having a predefined area is also illustrated.

FIG. 2B illustrates an exemplary false error pattern in a false error pattern database. The false error pattern includes the same pattern as a subset of the design clip C. In the false error pattern, the region including the geometrical feature including the violation of a minimum spacing rule between two design shapes representing line structures (shaded regions each including dark squares) is marked by "S."

The false error pattern in FIG. 2B, which is one of the false error patterns in the false error pattern database, matches a subset of the exemplary design clip of FIG. 2A, which can be a design clip generated from the i-th design error associated with the geometrical feature including the violation of a minimum spacing rule between two design shapes representing line structures. The exemplary false error pattern in FIG. 2B has been shown not to pose a problem at mask manufacturing, and as a consequence, has been included in the false error pattern database. Thus, the design clip C within the design layout of FIG. 2A is unlikely to pose a problem at mask production, and as such, is classified as a false error that can be safely ignored without requiring any modification thereupon.

Optionally, an output error list can be generated by removing each error that is resolved in the steps of the flow chart of FIG. 1 from the indexed list of design errors. If such an output error list is generated, the output error list excludes the i-th design error if the i-th design error is identified as a false error, and does not exclude the i-th design error if the i-th design error is identified as a real error.

Referring to step 840, no change is made to the design layout because the i-th design error has been identified as a false error. As a corollary, the portion of the design clip corresponding to the i-th design layout remains unchanged at step 840. In other words, the subset of the design layout that corresponds to the false error is preserved without a change in the design layout.

Referring to step 845, once the i-th design error has been identified as a real error, another automated program, which is herein referred to as a second automated program, determines whether any match exists for the i-th design error in a real error pattern database. As used herein, a "real error pattern database" refers to a database that contains previously known pairs of an error-containing pattern and a corresponding error-free pattern that corrects the error-containing pattern at, or around, the feature that is the basis of a design error in the error-containing pattern in a manner that resolves the design error. The real error pattern database includes a collection of pairs of an error-containing pattern and the corresponding error-free pattern as generated from previous work on another design layout or the design layout provided at step 810.

At step 845 of the flow chart, a design clip including the feature that causes the i-th design error is generated by running a second automated program. The second automated program is run on a computing means, which can be the same as, or different from, the computing means on which the first automated program of step 835 of the flow chart is run.

For each design error, the second automated program at step 845 of the flow chart is run only if the first automated program determines that there is no match between the design clip corresponding to the design error and the false error patterns in the false error pattern base at step 835 of the flow chart. The design clip generated for the i-th design error at step 845 can be different from the design clip for the i-th design error employed at step 835 of the design layout. In one embodiment, the design clip for the i-th design error can have a predetermined size around the feature that triggers the i-th design error during running of the mask rule check program.

In one embodiment, the size of the design clip corresponding to the i-th design error as generated at step 845 can be determined by the optical radius of the lithography system to be employed to print patterns employing a photomask to be manufactured from a corrected design layout, which is generated from the initial design layout provided at step 810 and modified through the steps of the flow chart of FIG. 1 and optional subsequent modifications. The optical radius is the maximum lateral dimension within which a feature in a design layout for a given lithography technology node can trigger significant interference effects on another feature. The optical radius of for a lithography technology node varies depending on the wavelength of the illumination source and the numerical aperture. The optical radius for lithography technology employing 193 nm wavelength radiation source can be on the order of 2.5 microns, and the size of the design clip identified by the i-th design error can have the size of about 5 microns by 5 microns.

For example, for a design layout to be employed in conjunction with a 193 nm wavelength lithography system, the size of the design clip for each i-th design error can have be a rectangle in which each side has a dimension in a range from 3 micron to 6 microns, although lesser and greater dimensions can also be employed. In an illustrative example, the design clip can have a square size with the length of each side set at 5.0 micron.

Once the design clip corresponding to the i-th design error is generated, the second automated program determines whether a match exists among the error-containing patterns in the real error pattern database for the design clip corresponding to the i-th design error.

The second automated program can determine the existence of a match for the i-th design error in the real error pattern database by determining, for the i-th design error which is under examination, whether an error-containing pattern in the real error pattern database matches a first pattern defined by an inner window around an error feature triggering identification of the i-th design error and additionally provides a pattern match score above a predefined threshold value for a second pattern defined by an outer window around the error feature. The outer window is larger than the inner window and includes the inner window.

Figure 3A:
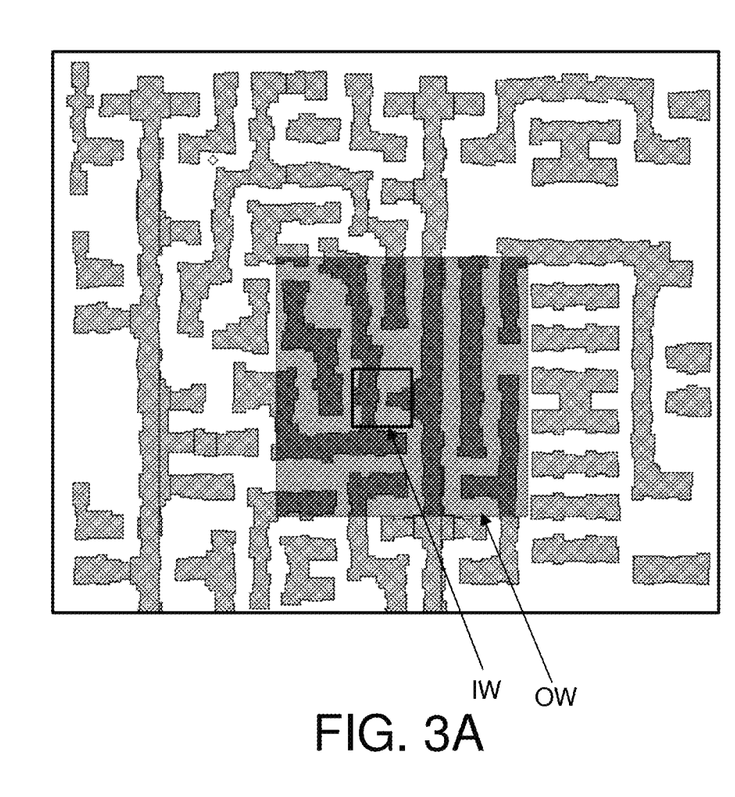
FIG. 3A is an exemplary design layout including a design clip defined by an outer window and corresponding to a design error caused by a feature within an inner window. The outer window includes the inner window therein. A match for the outer window is present among error-containing patterns in a real error pattern database according to an embodiment of the present disclosure.

Determination of the match in the real error pattern database for a design error is illustrated employing an exemplary case involving various design layouts or clips illustrated in FIGS. 3A-3D. FIG. 3A is an exemplary design layout including a design clip defined by an outer window OW. The size of the outer window is identical to the size of the design clip. The design clip shown in FIG. 3A corresponds to a selected design error under examination, which is caused by an error feature within the design clip. The error feature is the features that is the basis of the identification of the selected design error within the design layout of FIG. 3A. The design clip can be defined from the location of the error feature and predefined parameters, including a predetermined size for design clips to be generated. The predefined parameters can be provided in the second automated program for automatic generation of a corresponding design clip feature an error feature.

Figure 3B:
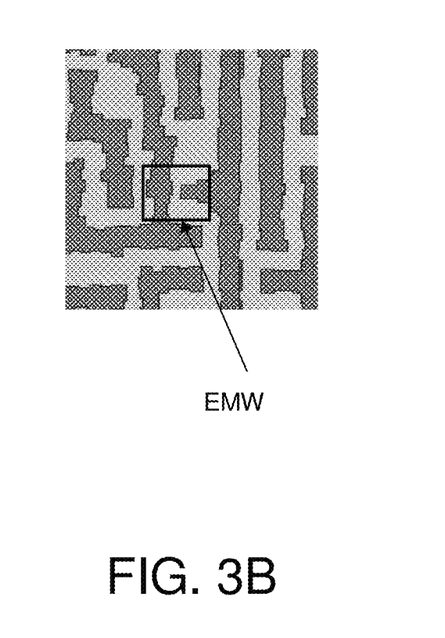
FIG. 3B is a portion of an exemplary error containing pattern in the real error pattern database that corresponds to the design clip defined by the outer window of FIG. 3A according to an embodiment of the present disclosure.

In the exemplary case, a match for the design clip defined by the outer window OW in FIG. 3A is present among error-containing patterns in the real error pattern database. FIG. 3B illustrates an error-containing pattern within the real error pattern database that can be matched to the design clip defined by the outer window OW. The error-containing pattern illustrated in FIG. 3B includes an exact match window EMW. The exact match window EMW includes an error features for which a solution is known. In order for the design clip defined by the outer window OW in FIG. 3A to match the error-containing pattern in FIG. 3B, the design clip defined by the outer window OW in FIG. 3A must contain a region that provides an identical match with the exact match window EMW within the error-containing pattern in FIG. 3B. The second automated program can identify the area within the design clip defined by the outer window OW in FIG. 3A as an inner window IW. The outer window OW is larger than the inner window IW and includes the inner window IW. Since the error feature is present within the exact match window EMW in FIG. 3B, the same error feature is present within the inner window IW in FIG. 3A. Thus, the error-containing pattern of FIG. 3B in the real error pattern database matches a first pattern defined by the inner window IW in FIG. 3A around the error feature triggering identification of a design error.

Figure 3C:
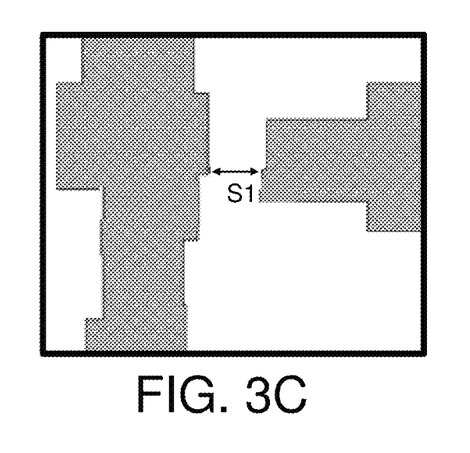
FIG. 3C is a portion of a magnified view of the inner window of the design clip shown in FIG. 3A according to an embodiment of the present disclosure.
Figure 3D:
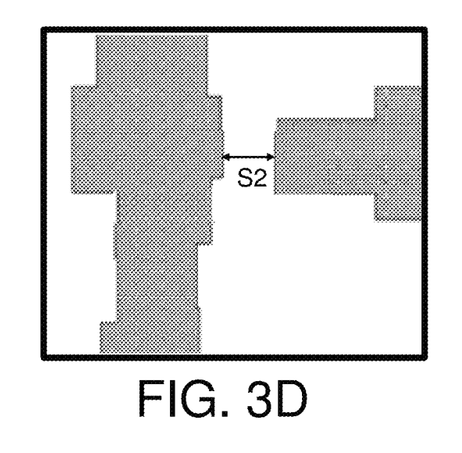
FIG. 3D is a portion of a magnified view of an exact match window of the error-free pattern shown in FIG. 3C according to an embodiment of the present disclosure.

The exact match window EMW in FIG. 3B, which has identical shapes as the first window defined by the inner window IW in FIG. 3A, is illustrated in FIG. 3C. FIG. 3C shows the error feature for the inner window IW, which is violation of a minimum spacing rule between two neighboring line structures. Specifically, the minimum spacing between two neighboring lines is S1 within the inner window IW in FIG. 3C, and has a value that is less than the least allowable value for spacing between two neighboring lines for the overall geometry shown in FIG. 3C. The violation of the minimum spacing rule is the error features, and causes identification of the design error as one of the design errors within the indexed list of design errors at step 820.

Once an exact match is found between the exact match window EMW of an error-containing pattern and an inner window IW of a design clip generated from the selected design error, the second automatic program determines a pattern match score between the region between the outer window OW and the inner window IW of FIG. 3A and the region of the error-containing pattern around the exact match window EMW. Any known program for determining a pattern match score can be employed for this purpose. In general, the greater the similarity between two compared patterns, the higher the pattern match score between the two compared patterns for the pattern match score.

The pattern within the design clip, i.e., the outer window OW, is herein referred to as a second pattern. If the pattern match score generation program returns a value that is greater than a predefined threshold value for the pattern match score between the second pattern and the error-containing pattern (such as the pattern of FIG. 3B), the second automated program determines that the second pattern matches the error-containing pattern. In this case, a "match" is said to exist between the second pattern of the design clip for the corresponding design error and the error-containing pattern.

The second program can test each error-containing pattern in the real error pattern database to determine whether a plurality of error-containing patterns in the real error pattern database match a corresponding first pattern and provide pattern match scores above the predefined threshold value. It is noted that the contents of the exact match window EMW can be different from one error-containing pattern to the next error-containing pattern, and thus, the corresponding first pattern defined within the outer window for any selected error-containing pattern including an identically matching exact match window can differ from one error-containing pattern to the next error-containing pattern. If a plurality of matches exists, an error-containing pattern having a highest pattern match score among the plurality of error-containing patterns may be selected. In this case, the error-containing pattern having the highest pattern match score provides the best match, and is selected as the matching error-containing pattern for the selected design error. Once a matching, or "best-matching," error-containing pattern is selected, the process flow proceeds to step 850 of the flow chart.

At step 850, the second automated program can locate the error-free pattern that corresponds to the error-containing pattern that matches the second pattern, and identifies the region of the error-free pattern that corresponds to the exact match window EMW within the error-containing pattern. The pattern within the error-free pattern that corresponds to the exact match window EMW is herein referred to as a replacement window.

The second automated program or a third automated program can be run on a computing means to modify the portion of the design layout including the second pattern. In other words, the second automated program or a new automated program can be employed to perform the next task. The computing means on which this portion of the second automated program or the third automated program runs can be the same as, or different from, the computing means running the portion of the second automated program that determines whether a match exists second pattern of the design clip for the corresponding design error and the error-containing pattern.

Specifically, once the i-th design error of the design layout that has been determined to have a match in the real error pattern database, the second or third automated program replaces a matched error-containing portion of corresponding to the i-th design error of the design layout with a corresponding error-free pattern, which is the design pattern within the replacement window. As discussed above, the replacement window is a portion of an error-free pattern that corresponds to the error-containing pattern found to match the second pattern. At each iteration of step 850 of the flow chart, a matched error-containing portion of corresponding to a design error of the design layout is replaced with a corresponding error-free pattern, which differs from the pattern of an outer window by the correction present within the replacement window in the corresponding error-free pattern in the real error pattern database.

In each case of replacement with the replacement window, the matched error-containing portion in the design clip corresponding to the outer window OW is the first pattern, which is identical to the exact match window EMW of the matched error-containing pattern. The corresponding error-free pattern includes the pattern of the replacement window, which is a pattern identical to the first pattern except for a modification that modifies the error feature to conform to design rules. Thus, if a match is found for the i-th design error by the second automated program in the real pattern error database, a change is made to the design layout to modify the features that is the ground for the i-th design error and renders the modified portion of the design layout compliant with the design rules, and particularly, to the mask rule check.

It is noted that the error-containing patterns in the real error pattern database do not need to be in the same size as the design clips generated at step 845 of the flow chart, but can be larger or smaller than the size of the design clips identified at step 845 because the function that determines the pattern matching score can accommodate differences in the sizes of the design clips. The pattern matching performed by the second automated program includes two routines, which include a first routine that requires an exact match in the vicinity of an error-generating design feature, and a second routine that requires a qualitative matching among two design patterns.

Referring back to step 845 of the flow chart, if an output error list is generated in the steps of the flow chart of FIG. 1, the output error list excludes the i-th design error if a design clip corresponding to the i-th design error is found to have a match in the real error pattern database, and consequently, the process flow proceeds to step 850. In other words, the output error list excludes each design error for which a match exists in the real error pattern database. If the process flow proceeds from step 845 to step 855, the i-th design error is not removed from the list of design errors at step 845.

Referring to step 855, if no match exists in the real error pattern database for the i-th design error, an automated program is run to determine whether an applicable waiver exists in a mask house rule database. A mask house rule database is a database storing rules provided by the mask house that plans to manufacture a photomask embodying a modified version of the design layout provided at step 810 and embodying the corrections provided by the various steps of the flow chart of FIG. 1. The mask house rule database may reside within a computing means that runs the various programs of the present disclosure, may be a standalone database that is located on the site at which the computing means running the automated program of step 855 resides, or may be located, or controlled by, a mask house that plans to manufacture a photomask embodying the modified version of the design layout provided at step 810.

If an applicable waiver exists in a mask house rule database for the i-th design error, the process flow proceeds to step 860, at which the i-th design error is waived or corrected employing the waiver provided by the mask house rule database and/or employing the solution provided by the mask house rule database.

If an output error list is generated in the steps of the flow chart of FIG. 1, the output error list excludes the i-th design error if an applicable waiver exists in the mask house rule database for the i-th design error, and consequently, the process flow proceeds to step 860. Thus, if the i-th design error is waived or corrected at step 860, the output error list does not include the i-th design error. In other words, the output error list excludes each design error for which an applicable waiver exists in a mask house rule database. After step 860, the process flow proceeds to step 865.

The combination of steps 855 and 860 is optional. In other words, steps 855 and 860 may be present in the flow chart, or may be collectively removed from the flow chart. If step 855 and step 860 are absent, the process flow for the case in which no match exists in the real error pattern database for the i-th design error proceeds to step 870.

If an applicable waiver does not exists in the mask house rule database for the i-th design error at step 855, the process flow proceeds to step 870, or, in the case in which the output error list is not generated, the process flow proceeds to step 865.

At the end of step 840, 850, 860, or 870, the process flow proceeds to step 865, at which the value of index i is checked to determine if all design errors in the indexed list of design errors generated at step 820 have been addressed. If the index i is not at the final value, the process flow proceeds to step 880, at which the value of the index i is incremented to the next value. Then the process flow proceeds to step 835 with the incremented value of the index i.

If the value of the index i, as checked at step 865, is at the final value, this condition means that all of the design errors in the indexed list of design errors generated at step 820 have been addressed at this point. In this case, the process flow proceeds to step 890, at which the most recent version of the output error list can be output and/or the collection of automated programs of the flow chart of FIG. 1 can be terminated.

The modified design layout includes lesser design errors than the initial design layout provided at step 810. The list of design errors contained in the output error list includes only the design errors that have not been addressed, and requires further attention. In other words, the design errors that the automated programs have determined to be false errors that can be safely ignored without modification and fixable errors having known solutions as provided in the real error pattern database have been removed from the output error list. Thus, the flow chart of FIG. 1 provides a short loop for the purpose of correcting design errors in which the automated programs eliminate design errors significantly employing previously known solutions, and provides a list consisting of design errors for which no prior known solution exists. The short loop of FIG. 1 can reduce time and efforts that designers need to spend to resolve design errors that are flagged by the mask rule check program.

Figure 4:
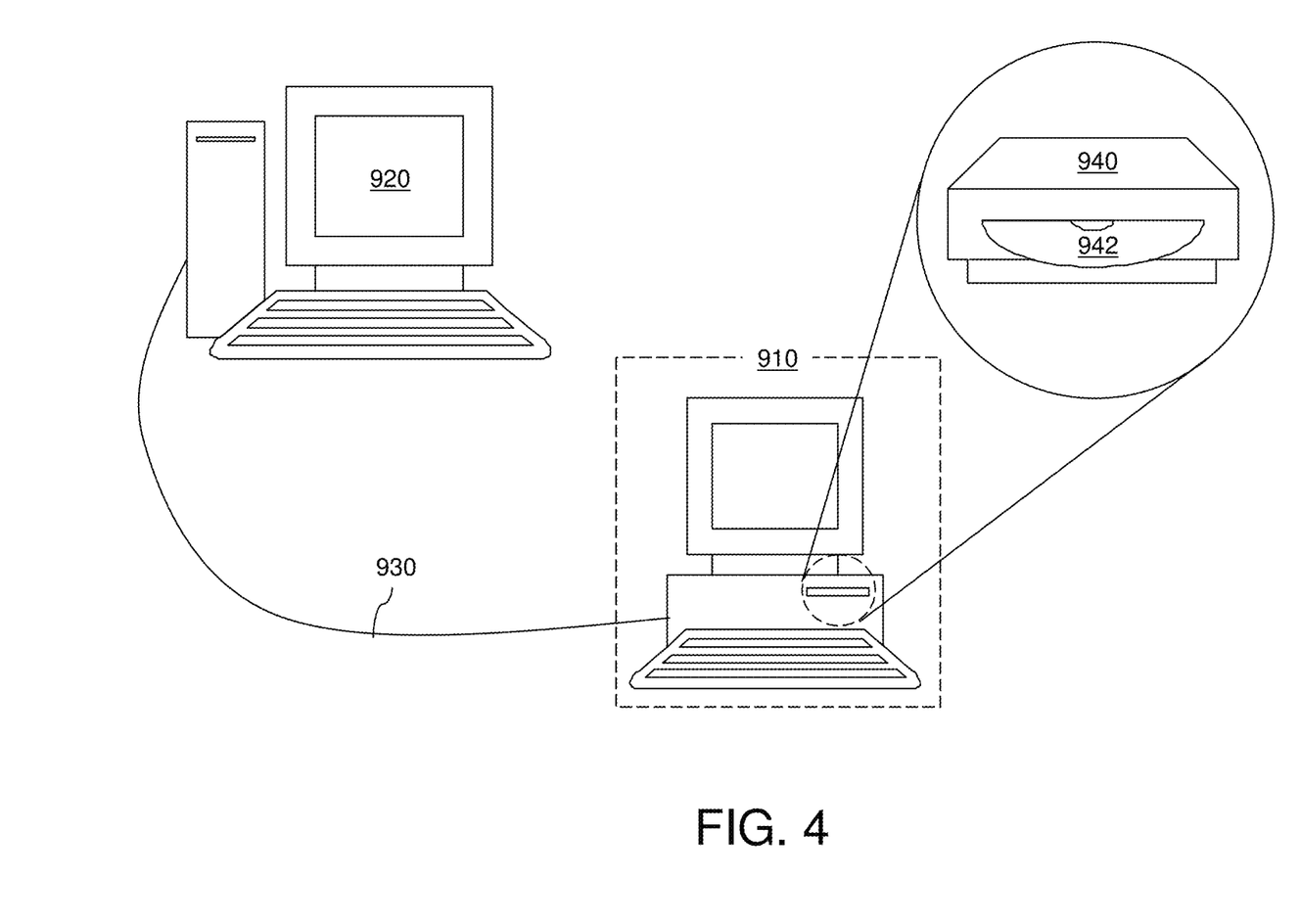
FIG. 4 is an illustration of an exemplary system that performs the methods of the present disclosure according to an embodiment of the present disclosure.

Referring to FIG. 4, a system can be provided for performing optical proximity correction on a design layout. The system can include at least one computing means 910, which can be a computer or any computing device known in the art. The at least one computing means 910 includes a processor and a memory that are configured to run an automated program. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910. The system further includes a non-transitory machine-readable data storage medium, which can be embedded within the at least one computing means 910, can be present within the database 920, or can be provided as a portable non-transitory machine-readable data storage medium 942 that can be accessed employing a data-writing device 940, which can optionally perform the task of reading data from the portable non-transitory machine-readable data storage medium 942. The database 920 can store design layouts and various automated programs, and can house a false error pattern database, a real error pattern database, and/or the mask house rule database. If the database 920 is not provided, design layouts, various automated programs, a false error pattern database, a real error pattern database, and/or the mask house rule database can be stored in the at least one computing means 910.

The at least one computing means 910 can be employed to perform at least one or all steps of the flow chart of FIG. 1 automatically without human intervention once a design layout is provided. The result derived from any of the steps of FIG. 1 can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable storage of any data derived from the steps of FIG. 1.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of modifying a design layout, said method comprising:
   providing an indexed list of design errors that are present in a design layout;
   determining, by miming a first program on a computing means, for each design error in said indexed list, whether a match exists in a false error pattern database that contains previously known waivered patterns;
   determining, by running a second program on said computing means or another computing means, for each design error that has been determined not to have a match in said false error pattern database, whether a match exists in a real error pattern database that contains previously known pairs of an error-containing pattern and a corresponding error-free pattern;
   replacing, by running said second program or a third program on said computing means, said another computing means, or yet another computing means, a matched error-containing portion of each design error of said design layout that has been determined to have a match in said real error pattern database with a corresponding error-free pattern, thereby modifying said design layout; and
   creating a photomask based on the modified design layout, wherein determining existence of a match in said real error pattern database comprises determining, for a selected design error under examination, whether an error-containing pattern in said real error pattern database matches a first pattern defined by an inner window that is identical to the size of the error-containing pattern and is around an error feature triggering identification of said selected design error and whether a pattern match score above a predefined threshold value is provided for a second pattern defined by an outer window around said error feature, said outer window being identical to the size of a predetermined design clip of said design layout and being larger than said inner window.

2. The method of claim 1, further comprising:
   classifying each design error for which a match is found in said false error pattern database as a false error, and
   preserving a subset of said design layout that corresponds to said false error without a change.

3. The method of claim 2, further comprising generating an output error list, said output error list excluding each of said false errors.

4. The method of claim 3, wherein said output error list excludes each design error for which a match exists in said real error pattern database.

5. The method of claim 4, further comprising determining, for each design error for which no match is found in said false error pattern database and said real error pattern database, whether an applicable waiver exists in a mask house rule database.

6. The method of claim 5, wherein said output error list excludes each design error for which an applicable waiver exists in said mask house rule database.

7. The method of claim 1, further comprising:
   determining whether a plurality of error-containing patterns in said real error pattern database match a corresponding first pattern and provide pattern match scores above said predefined threshold value; and
   if said plurality exists, selecting an error-containing pattern having a highest pattern match score among said plurality of error-containing patterns.

8. The method of claim 1, wherein said matched error-containing portion is said first pattern and said corresponding error-free pattern includes a pattern identical to said first pattern except for a modification that modifies said error feature to conform to design rules.

9. The method of claim 1, further comprising generating said indexed list of design errors by miming a mask rule check program on said design layout.

10. A system for modifying a design layout, said system comprising a computing means and a non-transitory machine-readable data storage medium, wherein said computing means comprises a processor and a memory that are configured to run an automated program comprising steps of:
    receiving an indexed list of design errors that are present in a design layout;
    determining, for each design error in said indexed list, whether a match exists in a false error pattern database that contains previously known waivered patterns;
    determining, for each design error that has been determined not to have a match in said false error pattern database, whether a match exists in a real error pattern database that contains previously known pairs of an error-containing pattern and a corresponding error-free pattern;

replacing a matched error-containing portion of each design error of said design layout that has been determined to have a match in said real error pattern database with a corresponding error-free pattern, thereby modifying said design layout; and creating a photomask based on the modified design layout, wherein said step of determining existence of a match in said real error pattern database comprises determining, for a selected design error under examination, whether an error-containing pattern in said real error pattern database matches a first pattern defined by an inner window that is identical to the size of the error-containing pattern and is around an error feature triggering identification of said selected design error and whether a pattern match score above a predefined threshold value is provided for a second pattern defined by an outer window around said error feature, said outer window being identical to the size of a predetermined design clip of said design layout and being larger than said inner window.

11. The system of claim 10, wherein said automated program further comprises steps of:
classifying each design error for which a match is found in said false error pattern database as a false error, and
preserving a subset of said design layout that corresponds to said false error without a change.

12. The system of claim 11, wherein said automated program further comprises a step of generating an output error list, said output error list excluding each of said false errors.

13. The system of claim 12, wherein said output error list excludes each design error for which a match exists in said real error pattern database.

14. The system of claim 13, wherein said automated program further comprises a step of determining, for each design error for which no match is found in said false error pattern database and said real error pattern database, whether an applicable waiver exists in a mask house rule database.

15. The system of claim 14, wherein said output error list excludes each design error for which an applicable waiver exists in said mask house rule database.

16. The system of claim 10, wherein said automated program further comprises steps of:
determining whether a plurality of error-containing patterns in said real error pattern database match said first pattern and provide pattern match scores above said predefined threshold value; and
if said plurality exists, selecting an error-containing pattern having a highest pattern match score among said plurality of error-containing patterns.

17. The system of claim 10, wherein said matched error-containing portion is said first pattern and said corresponding error-free pattern includes a pattern identical to said first pattern except for a modification that modifies said error feature to conform to design rules.

18. The system of claim 10, wherein said automated program further comprises a step of generating said indexed list of design errors by running a mask rule check program on said design layout.

19. The system of claim 10, wherein said creating the photomask based on the modified design layout comprises creating the photomask based on the modified design layout using a photomask material.

* * * * *